United States Patent [19]

Pasqualoni et al.

[11] Patent Number: 5,403,975
[45] Date of Patent: Apr. 4, 1995

[54] ANODIZED ALUMINUM ELECTRONIC PACKAGE COMPONENTS

[75] Inventors: Anthony M. Pasqualoni, Hamden; Deepak Mahulikar, Meriden; Satish K. Jalota, Wallingford; Andrew J. Brock, Cheshire, all of Conn.

[73] Assignee: Olin Corporation, New Haven, Conn.

[21] Appl. No.: 114,994

[22] Filed: Aug. 31, 1993

Related U.S. Application Data

[60] Continuation of Ser. No. 762,128, Sep. 19, 1991, which is a division of Ser. No. 568,818, Aug. 17, 1990, Pat. No. 5,066,368.

[51] Int. Cl.$^6$ .............................................. H01L 23/02
[52] U.S. Cl. ................................. 174/52.4; 174/52.3; 257/678
[58] Field of Search ............... 205/213, 324; 174/52.1, 174/52.2, 52.3, 52.4; 361/728, 730, 736, 752, 760, 761, 762, 764, 765, 771; 257/678, 687, 701, 704

[56] References Cited

U.S. PATENT DOCUMENTS

| | | |
|---|---|---|
| 3,031,387 | 4/1962 | Deal et al. . |
| 3,328,274 | 6/1967 | Bushey et al. . |
| 3,423,298 | 1/1969 | Michelson et al. . |
| 3,597,339 | 8/1971 | Newman et al. . |
| 3,616,311 | 10/1971 | Barkman et al. . |
| 3,639,221 | 2/1972 | Dorsey, Jr. . |
| 3,669,855 | 6/1972 | Smith . |
| 3,708,407 | 1/1973 | Newman et al. . |
| 3,714,000 | 1/1973 | Dorsey, Jr. . |
| 3,793,089 | 2/1974 | Dorward et al. ............... 205/67 |
| 3,819,938 | 6/1974 | Kornrunpf et al. . |
| 3,833,484 | 9/1974 | Yanagida et al. . |
| 3,956,675 | 5/1976 | Bauer et al. ..................... 317/120 |
| 4,026,781 | 5/1977 | Newman et al. . |
| 4,193,848 | 3/1980 | Severus-Laubenteid .......... 205/118 |
| 4,405,971 | 9/1983 | Ohsawa ............................ 361/761 |
| 4,489,487 | 12/1984 | Bura ................................ 361/760 |
| 4,492,217 | 1/1985 | Scheidler ......................... 219/464 |
| 4,616,238 | 10/1986 | Tani et al. ........................ 346/137 |
| 4,771,637 | 9/1988 | Kubler ............................. 73/493 |
| 4,791,075 | 12/1988 | Lin .................................. 361/772 |
| 4,898,651 | 2/1990 | Mahmoud . |
| 4,916,805 | 4/1990 | Ellrich et al. .................... 29/832 |
| 4,931,151 | 6/1990 | Srinivasan et al. . |
| 4,939,316 | 7/1990 | Mahulikar et al. . |
| 4,996,629 | 2/1991 | Christiansen et al. ........... 361/772 |
| 5,013,871 | 5/1991 | Mahulikar et al. . |
| 5,023,398 | 6/1991 | Mahulikar et al. . |
| 5,043,534 | 8/1991 | Mahulikar et al. . |

FOREIGN PATENT DOCUMENTS

| | | |
|---|---|---|
| 59-162300 | 9/1984 | Japan . |
| 63-112193 | 5/1988 | Japan . |
| 2112580 | 4/1990 | Japan . |

OTHER PUBLICATIONS

Anodizing Processes appearing in Metals Handbook, Ninth Edition, vol. 5, entitled "Surface Cleaning, Finishing and Coating" (1982) pp. 585–597.

Silman et al "Protective and Decorative Coatings for Metals", published by Finishing, Ltd. Middlesex, England (1978) at pp. 460–463.

Neufeld et al, "The Development of Pore and Cellular Structures in Anodic A1203 Films", appearing in the Transactions of the Institute of Metal Finishing, vol. 48, Part 5 (Winter 1970) at pp. 175–181.

Silman et al. "Protective and Decorative Coatings for Metals" Finishing Publications Ltd. Middlesex, England (1978) at pp. 456–459.

*Primary Examiner*—Bot Ledynh
*Attorney, Agent, or Firm*—Gregory S. Rosenblatt

[57] ABSTRACT

A process for producing electronic package components from an aluminum alloy is disclosed. The components have a black color through integral color anodization. The desired color, thickness and surface finish are achieved by regulation of amperage during anodization. The amperage is rapidly raised to in excess of 80 amps per square foot and then allowed to gradually decrease as a function of oxide growth.

6 Claims, 2 Drawing Sheets

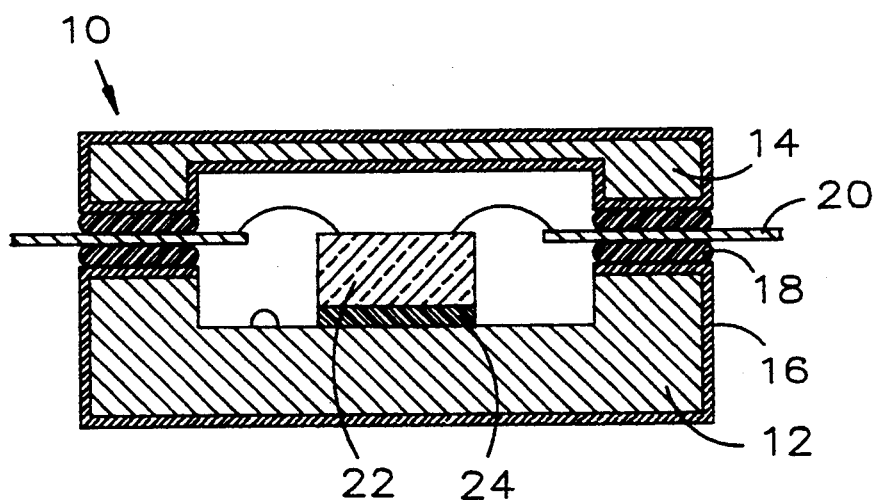
PRIOR ART   FIG. 1
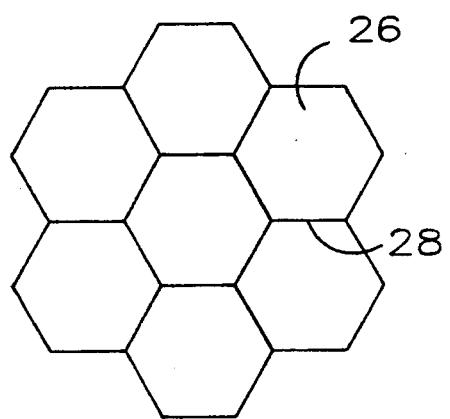
FIG. 2
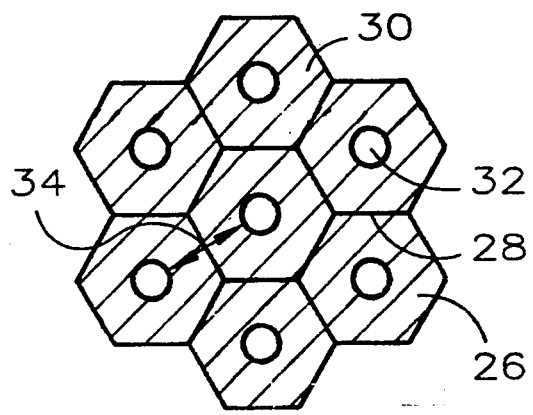
FIG. 3

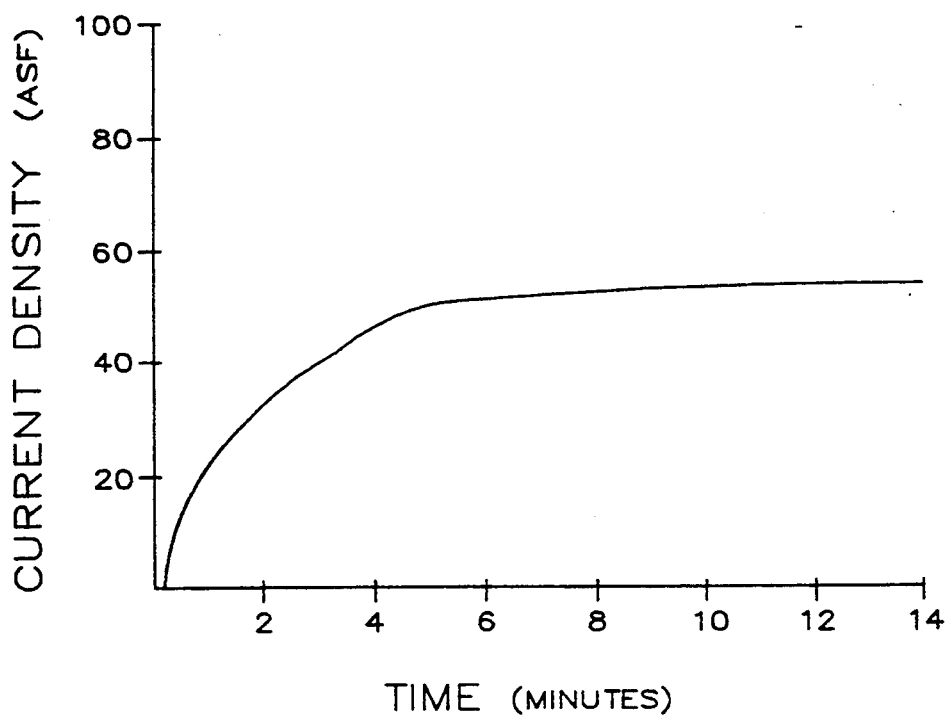
PRIOR ART    *FIG. 4*
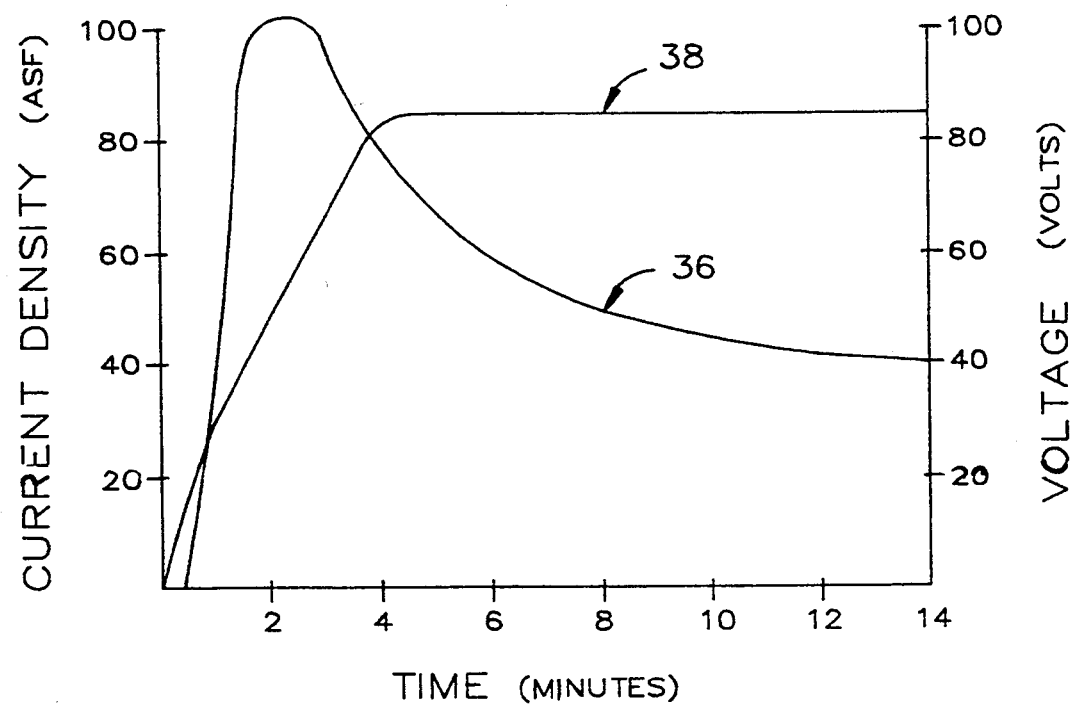
*FIG. 5*

ANODIZED ALUMINUM ELECTRONIC PACKAGE COMPONENTS

This application is a continuation of application Ser. No. 07/762,128, filed Sep. 19, 1991, is now abandoned, which is turn a division of application Ser. No. 07/568,818, filed Aug. 17, 1990, now U.S. Pat. No. 5,066,368.

FIELD OF THE INVENTION

This invention relates to anodized aluminum components for electronic packaging. More particularly, the components are coated with an anodization layer having a uniform black color to maximize infrared absorption and a toughened surface for improved adhesion.

BACKGROUND OF THE INVENTION

U.S. Pat. No. 4,939,316 to Mahulikar et al discloses an adhesively sealed package for housing an electronic device such as a semiconductor integrated circuit. The base and cover are formed from aluminum or an aluminum alloy. Disposed between the base and cover is a leadframe. An adhesive such as epoxy bonds the leadframe to both. At least those surfaces exposed to the atmosphere are anodized. Preferably, the surfaces which contact the adhesive are also anodized.

The anodized surface is roughened. A roughened surface increases the mechanical locking of the adhesive to improve bond strength. The anodization layer further provides salt spray corrosion protection for those surfaces exposed to the atmosphere.

The anodization layer is colored light black or black. The black color maximizes infrared (IR) absorption. IR heating is used to solder the leadframe to a printed circuit board or other external circuitry. Colors other than black have high IR reflectivity. The leads do not heat to the soldering temperature. The black color also has cosmetic value. Anodized aluminum packages supplement molded plastic packages which are generally colored black.

The thickness of the anodization film determines the thermal and electrical performance of the package. If the film is too thick, conduction of heat from a mounted semiconductor chip will be inadequate. Any rise in the operating temperature of the integrated circuit device decreases the functional life. A thinner anodization layer results in better thermal performance. Balanced against thermal performance is electrical insulation and corrosion resistance. The anodization film must be sufficiently thick to ensure good electrical insulation both between the exterior surfaces of the package and adjoining circuitry and the interior of the package and the device. Aluminum alloys are corroded by salt spray. The anodization layer must be sufficiently thick to resist corrosion.

The surface roughness of the anodization layer must be sufficient to provide good mechanical adhesion for the epoxy. The roughness cannot detract from the cosmetic appearance of the part or expose aluminum base metal.

Additionally, the anodization film must be sufficiently strong to tolerate assembly operations and post assembly testing and handling. Chemical resistance is required if the package is to be immersed in a plating solution such as to tin plate the leads. The anodization layer must be sufficiently strong and adherent to resist thermal stresses caused by the heating of the electronic device during IR soldering and thermal cycling. The corrosion resistance must be sufficient to withstand salt spray testing.

Anodization is usually clear or colored with a slight golden tinge. There are several ways to produce a more intense color. An organic dye can be impregnated in the pores of the anodic coating. Mineral pigments, such as iron oxide, can be precipitated in the pores. Both methods have limitations. It is difficult to get a uniform color from part to part. The coloring tends to fade or bleed over time.

A preferred method of coloring is integral color anodization. Pigmentation is caused by a variety of factors including the occlusion of micro particles in the coating. The micro particles are a product of the anodic reaction of the electrolyte with the constituents of the aluminum alloy. Alloy composition and temper strongly affect the color produced.

Integral color anodization is disclosed in U.S. Pat. No. 3,669,855 to Smith and U.S. Pat. No. 3,714,000 to Dorsey, Jr. U.S. Pat. No. 3,669,855 discloses an aqueous electrolyte having 64.6 gm/l sulfosalicylic acid, 5.8 gm/l sulfuric acid and 1.7 gm/l aluminum. Color is controlled by developing a voltage/time relationship. The amperage and plating time are controlled in accordance with the voltage/time relationship.

U.S. Pat. No. 3,714,000 discloses an electrolyte including an aromatic acid, such a benzoic or carboxylic acid.

U.S. Pat. No. 3,616,311 to Barkman discloses integral color anodization from a bath containing an inorganic acid such as sulfuric acid, a voltage component such as sulfonic acid and a metal salt of an organic acid for color control. The voltage is regulated to maintain a constant current of about 48 amps pert square foot.

The above processes do not satisfy the stringent requirements of an anodized aluminum package component. A controlled increase in amperage up to a steady state imparts a greenish color to the aluminum alloys and which is not acceptable for infrared heating. Hard anodizing at high voltages and high current densities produces a black corrosion resistant film. The film thickness is difficult to control leading to poor thermal characteristics.

SUMMARY OF THE INVENTION

Accordingly, it is an object of the invention to provide an anodization coating which is suitable for electronic package components. It is a further object of the invention to provide a process to produce the coatings. It is a feature of the invention that the coating has a uniform black color. The surface texture is a function of both small diameter pores and macroscopic roughness. The coating has good corrosion resistance to both chemicals and salt spray. It is a benefit of the invention that the process claimed is suitable for aluminum alloys of both the 3xxx and 6xxx series. It is a further benefit of the invention that the process is reproducible and uses conventional reagents. Yet another benefit of the invention is that the process is rapid. A desired thickness is obtained in a short time.

In accordance with the invention, there is provided electronic packaging components made from an aluminum alloy. The aluminum alloy is selected to be capable of black integral color anodization. The anodization layer is applied at least to those surfaces which are either exposed to the external environment or contact a bonding agent. The coating is formed by integral color anodization. The aluminum alloy is immersed in a suitable electrolyte. An increasing voltage is applied so that the current density increases within about three minutes from 0 to over about 70 amps per square foot. The voltage is then maintained at a sufficiently high value for a time sufficient to form a black integral color anodization layer of the desired thickness and surface finish.

The above stated objects, features and advantages of the invention will become more apparent from the drawings and specification which follow.

BRIEF DESCRIPTION OF THE FIGURES

FIG. 1 shows in cross sectional representation an adhesively sealed aluminum alloy electronic package as known in the prior art.

FIG. 2 shows in top planar view an aluminum alloy surface which has been stripped of anodization.

FIG. 3 shows in top planar view an aluminum alloy surface following anodization.

FIG. 4 shows in graphic representation an anodization current cycle as known in the prior art.

FIG. 5 shows in graphic representation voltage and current density cycles to form the integrally colored film of the invention.

DETAILED DESCRIPTION OF THE INVENTION

FIG. 1 shows in cross sectional representation an aluminum alloy semiconductor package 10 as known from U.S. Pat. No. 4,939,316. The package includes a base component 12 and cover component 14 formed from aluminum or an aluminum alloy. An anodization layer 16 coats at least those portions of the base 12 and cover 14 either exposed to the atmosphere or in contact with a bonding agent 18 which may be a polymer adhesive or sealing glass.

The aluminum alloy package 10 further includes a leadframe 20 which is disposed between the base 12 and cover 14 components and sealed to both by bonding agent 18. Typically, the leadframe is stamped or etched from copper or a copper alloy. The copper based leadframe provides both high electrical conductivity and a coefficient of thermal expansion approaching that of the aluminum alloy components. An electronic device 22 such as a silicon based semiconductor integrated circuit is bonded to the base component 12 by a suitable die attach material 24. To absorb thermally induced stresses, the die attach 24 is either compliant or includes a buffer system. One suitable compliant die attach is a silver filled epoxy.

The anodization layer 16 has a light black to black integral color. The color is required to maximize IR absorptivity and for cosmetic reasons. The color of an integrally colored anodization layer is derived from the oxides of the alloy constituents. Aluminum alloys of the invention have alloying constituents which contribute to the proper color. Two suitable alloy constituents are manganese and silicon. Preferred aluminum alloys are those designated by the ASM (American Society for Metals) as 3xxx and 6xxx series.

Alloys of the 3xxx series contain up to about 1.5 percent by weight manganese along with other alloying elements. The alloys are characterized by good thermal conductivity and about 20% higher strength than alloys designated as 1xxx series (greater than 99.00% aluminum).

Alloys of the 6xxx series contain magnesium and silicon in an approximate proportion to form $Mg_2Si$.

The alloys are characterized by good formability and good machinability. They are heat treatable and form a precipitation hardened alloy.

A most preferred aluminum alloy is aluminum alloy 3003 which has a nominal composition of about 0.12 percent by weight copper, about 1.2 percent manganese and the balance aluminum.

The anodization layer 16 has a light black to black color. The surface is roughened to provide mechanical adhesion to the bonding agent 18. The anodization layer 16 is sufficiently strong to tolerate assembly operations including tin plating, IR soldering and burn-in. The interrelation of color, surface finish and strength and how the characteristics are optimized will become clear with reference made to FIGS. 2 and 3.

FIG. 2 shows in top planar view a magnified portion of an aluminum alloy surface which has been stripped of an anodization coating. The surface contains a plurality of hexagonally shaped crystalline grains 26 separated by grain boundaries 28. The size of the crystalline grains and the corresponding mechanical properties are adjusted by conventional metallurgical techniques such as annealing and age hardening.

Anodization is carried out in a suitable electrolytic cell. The electronic package components serve as the cell anode. A suitable cathode is a lead alloy. A power supply impresses a voltage across the cell. The power supply is capable of providing a specified voltage or current. The power supply is further capable of providing increasing current or voltage at a specified rate. Any suitable electrolyte may be used to conduct current through the cell. A preferred electrolyte is a mixture of sulfuric and sulfosalicylic acids in a concentration range of from about 1 to 4 gm/l $H_2SO_4$ and from about 50 to 120 gm/l $C_7H_6O_6S$.

During anodization, a layer of oxide film 30, shown in FIG. 3, forms on the surface. The film extends across grain boundaries 28 forming an essentially continuous layer. Interposed within the film 30 are a plurality of pores 32. The pores 32 are located at the approximate center of the crystalline grains 26. As anodization proceeds, the electrolyte contacts the metal surface through the pores. The film 30 grows continuously upwards from the metal/oxide interface.

The pores 32 are one source of the surface roughness which increases the mechanical adhesion of a bonding agent such as polymer adhesive to the anodized aluminum alloy surface. If the pore diameter is too large, the anodization cell wall 34 is excessively thin. Thin cell walls result in a coating with poor abrasion resistance.

If the diameter of the pores 32 is too small, the surface tension of the epoxy or other polymer adhesive prevents the adhesive from penetrating the pores resulting in a weak polymer/metal bond.

It is believed the optimum pore size is from about 50 to about 500 angstroms in diameter. More preferably, the pore size should be from about 75 to about 200 angstroms. Pores of the desired size are formed when the peak current density exceeds about 70 amps per square foot (ASF). Preferably, the peak current density is in the range of from about 80 to about 110 ASF.

The pore size is determined by factors including the temperature of the electrolyte, strength of sulfuric acid and the peak current density during the time a substantially continuous anodization film is formed. By controlling the peak current density during this phase of the anodization cycle, the pore size is regulated. The higher the current density, the smaller the pore diameter. To accurately control pore size, both peak current density and the time to reach the peak must be regulated. Once the pore size has been established, the current density may be reduced. A subsequent reduction in current density is desirable. The anodization film then grows at a slower rate and overall thickness may be accurately controlled. Anodization is continued until the film thickness of from about 0.2 to about 1.0 mils is reached. A minimum film thickness is required to ensure good electrical insulation and corrosion resistance. The maximum film thickness is established by the thermal conduction requirements of the package. Most preferably, the film thickness is from about 0.5 to about 0.8 mils.

The anodization film forms quickly. The peak current density must be reached within about 3 minutes. Preferably, the time to reach the peak current density is from about 1.5 to 2.5 minutes. The current is rapidly increased by applying an increasing voltage potential. The voltage is continuously increased at a rate of from about 10 to about 50 volts per minute until the peak current density is reached. A more preferred rate of voltage increase is from about 30 to about 40 volts per minute. After the peak current density has been achieved, the voltage is either varied within limits or held constant as detailed below.

Peak current density controls the pore size. The current density after the peak determines the rate of film growth and macroscopic surface roughness. Macroscopic surface roughness refers to the overall texture of the film as measured with a profilometer. An average surface roughness in excess of about 4000 angstroms improves the adhesion of the polymer adhesive bonding agent. The macroscopic surface roughness should not be excessive. Any base metal exposed in low spots will lead to corrosion. Excessive roughness will interfere with package sealing and detract from the cosmetic appearance of the package.

Voltage determines the color and color intensity. A black color suitable for IR soldering requires a potential of at least about 70 volts. More preferably, the potential is from about 70 to about 90 volts. Excessive voltage generates heat which may lead to decomposition of the electrolyte and dissolution of the coating.

Some investigators determined the integral color originates at the metal/oxide film interface and the remainder of the film is essentially transparent. However, cross sectional analysis of the anodization films formed by the process of the invention showed bands of color through the film. The color continues to form after the peak current density has been achieved. The voltage is held at a value sufficiently high to maintain a black color through the anodization cycle. The voltage may be held constant or varied, as long as it remains high enough to produce the desired color.

The benefits of the process of the invention will be more clearly understood from the examples which follow:

EXAMPLE 1

Two one hundred piece samples (1 inch × 1 inch) of aluminum alloy 3003 were prepared for anodization by degreasing in 1,1,1, trichloroethane followed by cleaning in a mild alkaline soak. A microetch in a dilute phosphoric acid solution followed to remove a thin surface layer of material. Part preparation was completed by desmutting in a ferric sulfate/sodium bifluoride solution. A deionized water rinse followed each step of the activation process.

The cleaned parts were immersed in an electrolytic cell. The electronic package components formed the cell anode and a stainless steel cathode was employed. The electrolyte was sulfuric acid and sulfosalicylic acid at a concentration of 3.5 gm/l $H_2SO_4$ and 60 gm/l $C_7H_6O_6S$. The solution was maintained at a temperature of 20° C.

A first set of 100 parts (0.72 square feet) was anodized according to a conventional controlled ramp-up cycle as shown in FIG. 4. The anodization cycle provided a coating thickness in the range of 0.5–0.8 mils. The anodized parts exhibited good corrosion resistance and acceptable abrasion resistance. The parts were green in color and considered unacceptable for IR absorptivity for soldering.

EXAMPLE 2

A second set of 100 one inch square aluminum alloy 3003 parts were anodized in the sulfuric acid—sulfosalicylic acid solution using the same activation sequence. The voltage and current cycles were in accordance with the invention as illustrated in FIG. 5. The current density is indicated by the line 36. The current density was increased rapidly, within about 1½ minutes to in excess of 90 ASF. Following a peak current density of about 105 ASF, the current was allowed to gradually ramp down. The cycle produced an anodization film thickness of from about 0.5 to 0.8 mils.

Line 38 illustrates the applied voltage. The voltage was increased at a rate of about 40 volts per minute. The voltage was increased until the peak current density of 105 ASF was reached. At the point of peak current density, the voltage was about 65 volts. The voltage was further increased to about 85 volts to achieve a black integral color.

Once the 85 volt peak was reached, the voltage was held constant. Alternatively, the voltage could be varied within the range required for the black integral color. The voltage was held above 70 volts for a time sufficient to form an anodization film of the desired thickness. For a film 0.5–0.8 mils thick, this time is from about 8 to 12 minutes. The current density gradually decreased due to the increased resistivity of the thickening oxide layer.

When the desired thickness was reached, the parts were removed from the electrolyte, rinsed in deionized water and dried.

The parts anodized according to the current and voltage cycles of the invention had a uniform black color, good salt spray corrosion resistance, good mechanical abrasion resistance and good adhesion to a polymer adhesive. A significant increase in macroscopic surface roughness was measured as illustrated in Table 1. The roughness average of the surface was measured using a Dektak 3030 Surface Profilometer manufactured by Veeco Instruments, Plainview, N.Y.

TABLE 1

| | Measured Surface Roughness (Angstroms) | |
|---|---|---|
| Sample | Aluminum Alloy 3003 | Aluminum Alloy 3003 Anodized as in FIG. 5 |
| 1 | 2118 | 4421 |
| 2 | 2505 | 4639 |
| 3 | 1969 | 5928 |
| 4 | 1491 | 4797 |
| 5 | 1387 | 4631 |
| 6 | — | 3857 |
| Average | 1894 | 4712 |

The patents cited herein are intended to be incorporated by reference in their entirety.

It is apparent that there has been provided in accordance with this invention integrally colored aluminum alloy electronic packaging components and a process for applying an integral black color to the components. While the invention has been described in connection with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electronic package component, comprising:
   an aluminum alloy substrate having a first and an opposing second surface and sides;
   a black integral anodization layer coating at least said second surface and the sides of said aluminum alloy substrate, said anodization layer having pores with an average diameter of from about 50 to about 500 angstroms and an average macroscopic surface roughness in excess of about 4,000 angstroms;
   an integrated circuit device bonded to said aluminum alloy substrate; and
   a bonding agent in contact with a portion of said first surface.

2. The electronic package component of claim 1 wherein said anodization layer has pores with an average diameter of from about 75 to about 200 angstroms.

3. The electronic package component of claim 1 wherein said bonding agent is a polymer adhesive.

4. The electronic package component of claim 3 wherein said portion of said first surface contacting said bonding agent is also coated with a black integral anodization layer.

5. The electronic package component of claim 4 wherein said anodization layer has a thickness of from about 0.2 to about 1.0 mils.

6. The electronic package component of claim 5 wherein the thickness of said anodization layer is from about 0.5 to about 0.8 mils.

* * * * *